US011295952B2

(12) United States Patent
Lee et al.

(10) Patent No.: US 11,295,952 B2
(45) Date of Patent: Apr. 5, 2022

(54) APPARATUS FOR TREATING SUBSTRATE AND METHOD FOR TREATING APPARATUS

(71) Applicant: SEMES CO., LTD., Cheonan-si (KR)

(72) Inventors: Tae Sub Lee, Seoul (KR); Gyu Hyun Kim, Daejeon (KR); Sung Yong Lee, Anyang-si (KR); Donghyuk Seo, Cheonan-si (KR); Seo Jung Park, Goyang-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 16/896,428

(22) Filed: Jun. 9, 2020

(65) Prior Publication Data

US 2020/0388496 A1    Dec. 10, 2020

(30) Foreign Application Priority Data

Jun. 10, 2019    (KR) .......................... 10-2019-0068208

(51) Int. Cl.
*H01L 21/26* (2006.01)
*H01L 21/263* (2006.01)
(Continued)

(52) U.S. Cl.
CPC .... *H01L 21/2636* (2013.01); *H01L 21/02694* (2013.01); *H01L 21/67248* (2013.01)

(58) Field of Classification Search
CPC .......... H01L 21/02694; H01L 21/2636; H01L 21/67103; H01L 21/67178; H01L 21/67248
See application file for complete search history.

(56) References Cited

U.S. PATENT DOCUMENTS 8,504,958 B2 *  8/2013  Kariat ................... G06F 30/367
                                                        716/110
8,761,909 B2 *  6/2014  Navratil ................ G05B 17/02
                                                        700/31
(Continued)

FOREIGN PATENT DOCUMENTS

JP    2003234278 A    8/2003
JP    2003-257873 A   9/2003
(Continued)

OTHER PUBLICATIONS

Office Action for Korean Application No. 10-2019-0068208 dated Oct. 16, 2020.
(Continued)

*Primary Examiner* — Mohammed Shamsuzzaman
(74) *Attorney, Agent, or Firm* — Harness, Dickey & Pierce, P.L.C.

(57) ABSTRACT

An apparatus for treating a substrate is disclosed. The apparatus for treating the substrate includes a housing having a treatment space inside the housing, a plate to support the substrate inside the housing, a heating member provided inside the plate to heat the substrate and including a plurality of heating zones, a temperature measuring member to measure a temperature of the substrate with respect to each of the plurality of heating zones of the heating member, and a control unit to control a temperature for the heating member in a dynamic section of a temperature change graph measured in the temperature measuring member. The control unit performs temperature control with respect to each of the plurality of heating zones of the heating member to uniformize the thickness of the thin film on the substrate.

6 Claims, 10 Drawing Sheets

(51) Int. Cl.
    *H01L 21/02*     (2006.01)
    *H01L 21/67*     (2006.01)

(56) References Cited

U.S. PATENT DOCUMENTS

| | | | | |
|---|---|---|---|---|
| 10,996,572 | B2* | 5/2021 | Coskun | G03F 7/70633 |
| 2004/0163589 | A1* | 8/2004 | Kistler | B05B 1/3053 |
| | | | | 118/684 |
| 2005/0167514 | A1* | 8/2005 | Kaushal | G03F 1/68 |
| | | | | 236/1 C |
| 2014/0370623 | A1* | 12/2014 | Wu | H01L 31/0322 |
| | | | | 438/5 |
| 2020/0105549 | A1* | 4/2020 | Lee | H01L 21/67248 |
| 2020/0373178 | A1* | 11/2020 | Kim | H01L 21/67248 |

FOREIGN PATENT DOCUMENTS

| | | |
|---|---|---|
| JP | 2008-166514 A | 7/2008 |
| KR | 20000018617 A | 4/2000 |
| KR | 10-2002-0025732 A | 4/2002 |
| KR | 20060076089 A | 7/2006 |
| KR | 20070098644 A | 10/2007 |
| KR | 20150106104 A | 9/2015 |
| KR | 10-2018-0089296 A | 8/2018 |
| KR | 20180127536 A | 11/2018 |
| KR | 20180129681 A | 12/2018 |
| WO | WO-2005008755 A1 | 1/2005 |

OTHER PUBLICATIONS

Notice of Allowance for Korean Application No. 10-2019-0068208 dated Mar. 8, 2021.

* cited by examiner

US 11,295,952 B2

APPARATUS FOR TREATING SUBSTRATE AND METHOD FOR TREATING APPARATUS

CROSS-REFERENCE TO RELATED APPLICATIONS

A claim for priority under 35 U.S.C. § 119 is made to Korean Patent Application No. 10-2019-0068208 filed on Jun. 10, 2019, in the Korean Intellectual Property Office, the entire contents of which are hereby incorporated by reference.

BACKGROUND

Embodiments of the inventive concept described herein relates to an apparatus for treating a substrate and a method for treating a substrate, and more particularly, relate to an apparatus for treating a substrate and a method for treating a substrate, capable of controlling a heating member for the substrate.

To fabricate a semiconductor device, various processes, such as a photolithography, etching, deposition, ion implantation, and rinsing processes, are performed. Among them, the photolithography process, which is to form a pattern, performs an important function to realize the higher integration of a semiconductor device.

The photolithography process mainly includes coating, exposure, and developing processes, and a bake process is performed before and after the exposure process. The bake process is to perform heat treatment with respect to a substrate. According to the bake process, when the substrate is placed on a heating plate, the substrate is subject to the heat treatment by a heating member provided inside the heating plate.

However, there are many disturbance factors to exert an influence on an inner part of a chamber or a plate. The disturbance factors may be caused by the difference in performance of equipment or in performance for each heating zone of the heating member. Due to this disturbance factors cause, even if the same heat capacity is applied to the heating plate, uniform heat is not applied to the substrate. When the uniform heat is not applied to the substrate, an influence may be exerted in the uniformity of the thin film thickness of a photoresist liquid formed on the substrate.

SUMMARY

Embodiments of the inventive concept are to uniformize the thickness of a thin film formed on a substrate by partially adjusting the temperature of a heating member.

Embodiments of the inventive concept are to uniformize a thickness of a thin film formed on a substrate by adjusting the thickness of a thin film corresponding to each of a plurality of heating zones of a heating member.

The technical problems to be solved by the inventive concept are not limited to the aforementioned problems. Any other technical problems not mentioned herein will be clearly understood from the following description by those skilled in the art to which the inventive concept pertains.

An apparatus for treating a substrate is disclosed.

According to an exemplary embodiment, the apparatus for treating the substrate may include a housing having a treatment space inside the housing, a plate to support the substrate inside the housing, a heating member provided inside the plate to heat the substrate and including a plurality of heating zones, a temperature measuring member to measure a temperature of the substrate with respect to each of the plurality of heating zones of the heating member, and a control unit to control a temperature for the heating member in a dynamic section of a temperature change graph measured in the temperature measuring member.

The dynamic section may be a temperature section until a temperature of the plate reaches a normal temperature from when the substrate is placed on the plate which is heated to a specific temperature.

The control unit may form a profile of a thickness of a thin film on the substrate, which corresponds to a temperature measurement result of the temperature measuring member for each of the plurality heating zones.

The control unit may perform temperature control with respect to each of the plurality of heating zones of the heating member to uniformize the thickness of the thin film on the substrate.

The control unit may select a heating zone showing a specific value or more in error with a reference value based on the profile of the thin film thickness for the plurality heating zones, and perform temperature control using a temperature graph in the selected heating zone and a thin film thickness value corresponding to a thickness value of a thin film corresponding to the selected heating zone.

The control unit may control a temperature of the selected heating zone using a calorie loss of the plate, which is shown in the temperature graph of the selected heating zone, and a present thin film thickness and a desired thin film thickness of the selected heating zone.

The temperature of the heating member in the control unit may be controlled by adjusting a gain of a proportional-integral-derivative (PID) controller connected to the heating member.

According to an exemplary embodiment, a method for treating a substrate is disclosed.

The method for treating the substrate may include forming a thin film of a photoresist liquid on the substrate by heating the substrate coated with the photoresist liquid to volatilize a solvent contained in the photoresist liquid, and uniformizing a thickness of a film of the photoresist liquid by partially controlling a temperature of a plate to heat the substrate.

A temperature for a dynamic section of a temperature change graph of the substrate may be adjusted.

The method for treating the substrate may further include forming a thickness profile of the thin film of the photoresist liquid based on a temperature change of the substrate, and controlling a temperature using a desired photoresist liquid thickness, a present photoresist liquid thickness, a present temperature of the substrate, and a calorie loss of the plate, which is shown in the temperature graph of the substrate.

The controlling of the temperature may be performed by adjusting a gain of a PID controller.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
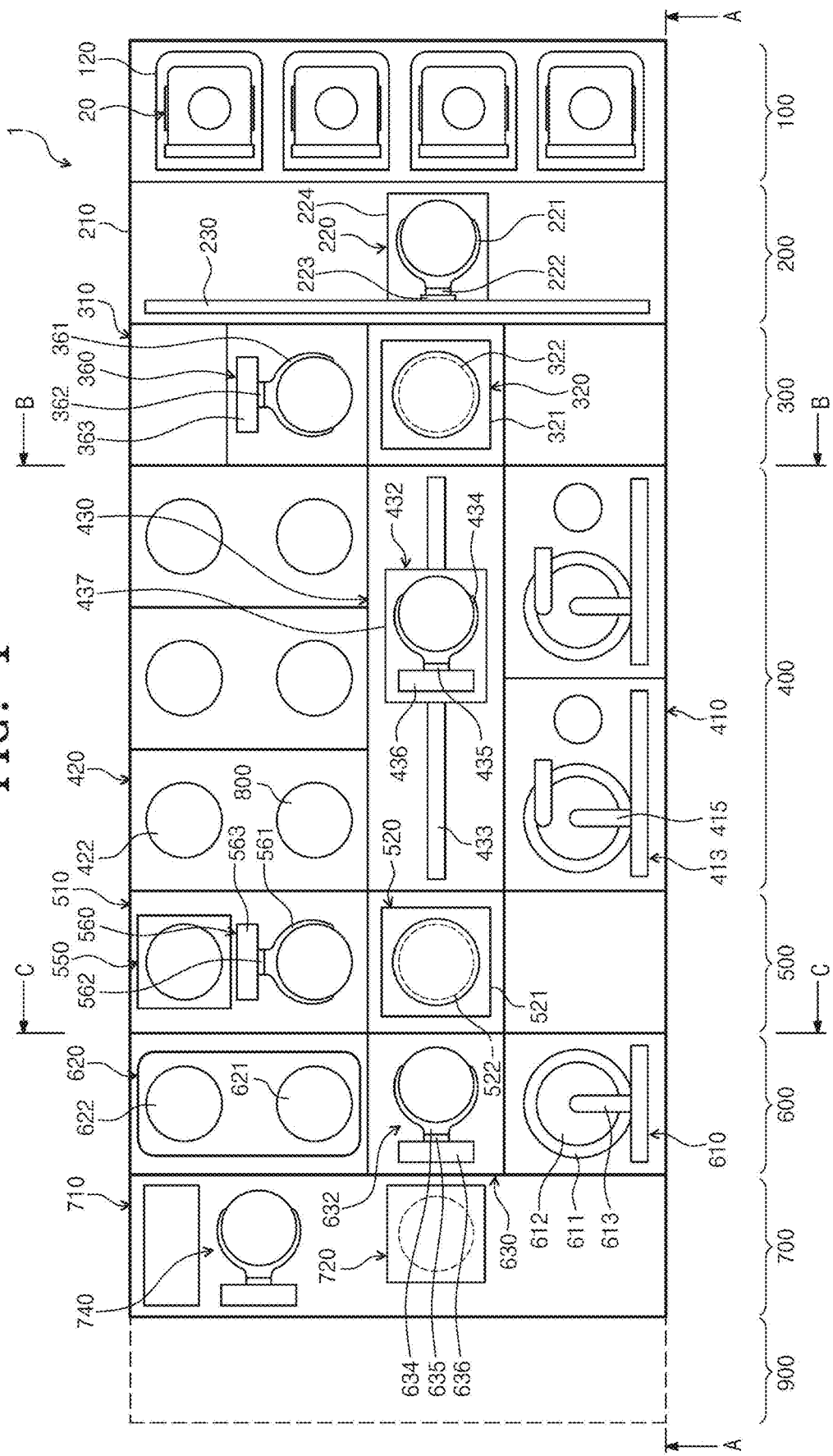
FIG. 1 is a view illustrating an apparatus for treating a substrate when viewed from above.
Figure 2:
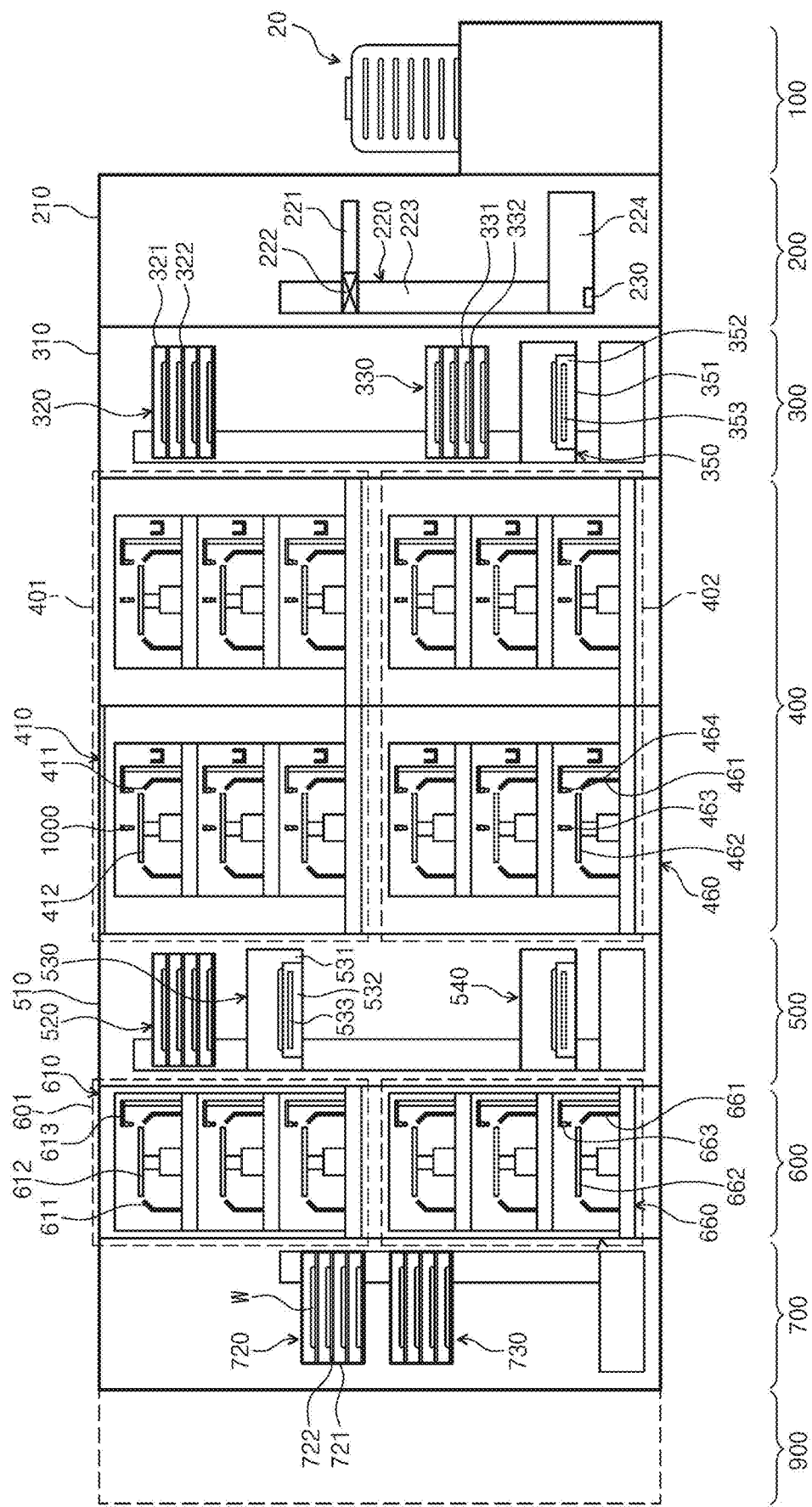
FIG. 2 is a view illustrating the apparatus for treating the substrate of FIG. 1 when viewed along line A-A.
Figure 3:
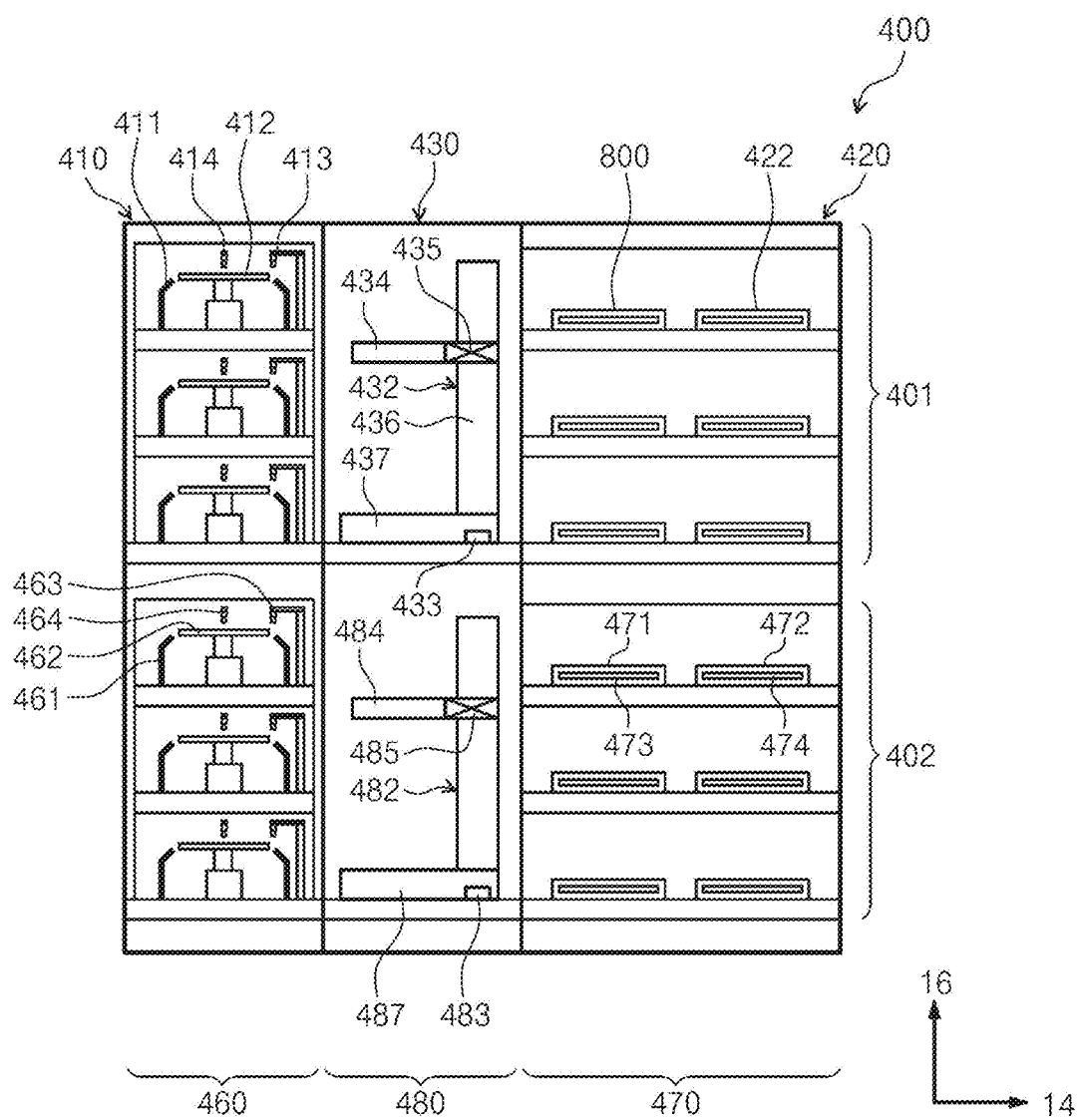
FIG. 3 is a view illustrating the apparatus for treating the substrate of FIG. 1 when viewed along line B-B.
Figure 4:
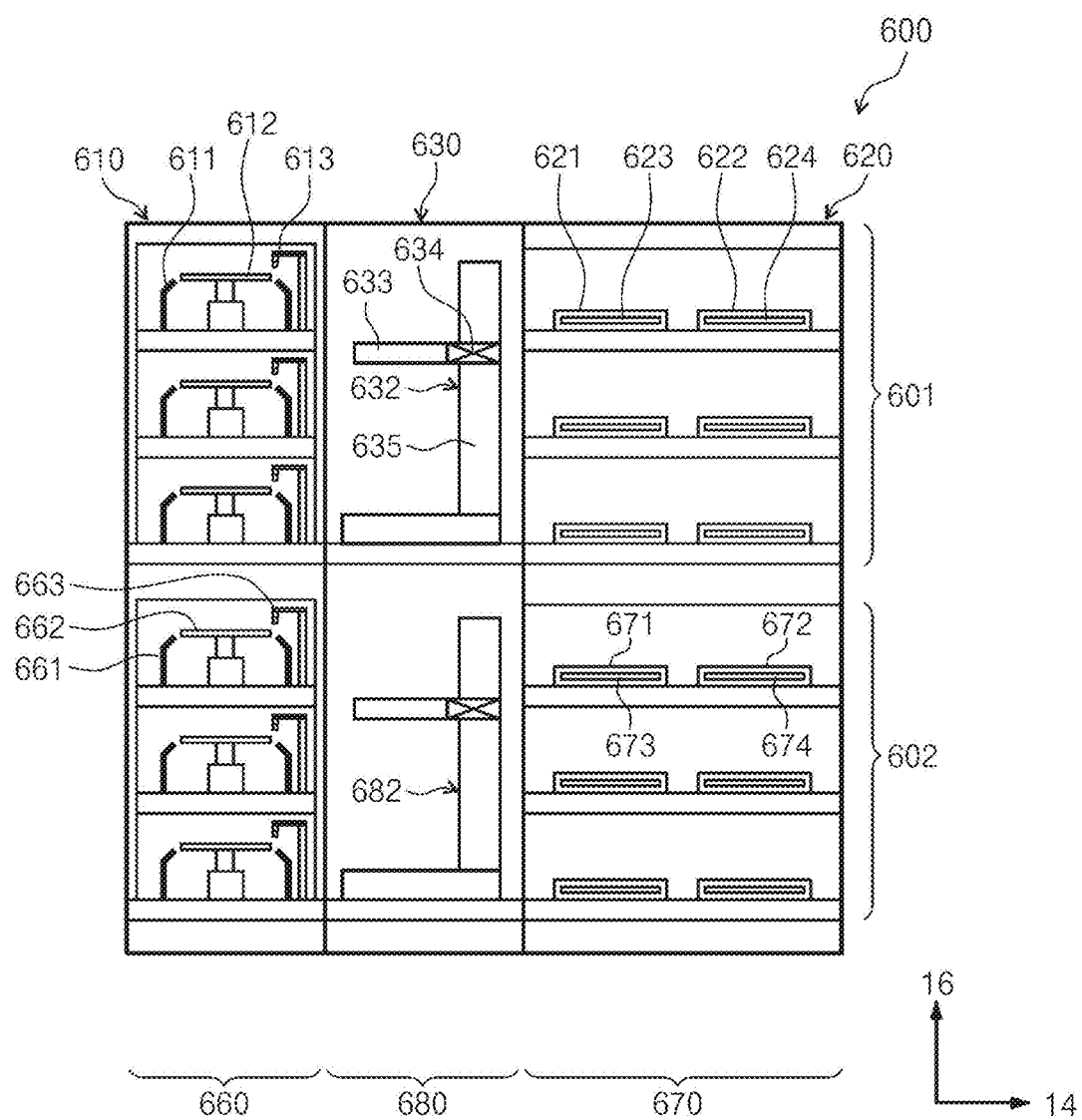
FIG. 4 is a view illustrating the apparatus for treating the substrate of FIG. 1 when viewed along line C-C.

Hereinafter, the embodiment of the present invention will be described in detail with reference to accompanying drawings to allow those skilled in the art to easily reproduce the present invention. However, the inventive concept may be implemented in various forms, and is limited to embodiments described herein. In addition, in the following description of the inventive concept, a detailed description of well-known art or functions will be ruled out in order not to unnecessarily obscure the gist of the inventive concept. In addition, parts performing similar functions and similar operations will be assigned with the same reference numerals throughout the drawings.

When a certain part "includes" a certain component, the certain part does not exclude other components, but may further include other components if there is a specific opposite description. In detail, it will be further understood that the terms "comprises," "comprising," "includes," or "including," or "having" specify the presence of stated features, numbers, steps, operations, components, parts, or the combination thereof, but do not preclude the presence or addition of one or more other features, numbers, steps, operations, components, components, and/or the combination thereof.

The singular forms are intended to include the plural forms unless the context clearly indicates otherwise. In addition, the shapes and the sizes of elements in accompanying drawings will be exaggerated for more apparent description.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

According to the present embodiment, equipment may be used to perform a photolithography process on a substrate such as a semiconductor wafer or a flat panel display panel. In particular, according to the present embodiment, the equipment may be connected to an exposure device and used to perform a coating process and a developing process. Hereinafter, the case that a wafer is used as a substrate by way of example.

FIGS. 1 to 4 schematically illustrate substrate treatment equipment according to an embodiment of the inventive concept.

Referring to FIGS. 1 to 4, a substrate treatment equipment 1 includes a load port 100, an index module 200, a first buffer module 300, a coating/developing module 400, a second buffer module 500, a pre/post-exposure treatment module 600, and an interface module 700. The load port 100, the index module 200, the first buffer module 300, the coating/developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating/developing module 400, the second buffer module 500, the pre/post-exposure treatment module 600, and the interface module 700 are disposed will be referred to as a first direction 12, and a direction that is perpendicular to the first direction 12 when viewed from above will be referred to as a second direction 14, and a direction that is perpendicular to the first direction 12 and the second direction 14 will be referred to as a third direction 16.

A substrate 'W' is moved while being received in a cassette 20. In this case, the cassette 20 has a structure that is sealed from the outside. For example, a front open unified pod (FOUP) that has a door on the front side may be used as the cassette 20.

Hereinafter, the load port 100, the index module 200, the first buffer module 300, the coating/developing module 400, the second buffer module 500, the pre/post-exposure treatment module 600, and the interface module 700 will be described in detail.

The load port 100 has a carrier 120 on which the cassette 20 having the substrates W received therein is placed. A plurality of carriers 120 are provided, and are disposed along the second direction 14 in a row. In FIG. 1, four carriers 120 are provided.

The index module 200 transfers the substrate 'W' between the cassette 20 placed on the carrier 120 of the load port 100 and the first buffer module 300. The index module 200 has a frame 210, an index robot 220, and a guide rail 230. The frame 210 has a substantially rectangular parallelepiped shape having a hollowed structure, and is interposed between the load part 100 and the first buffer module 300. The frame 210 of the index module 200 may be provided at a height lower than that of a frame 310 of the first buffer module 300, which will be described below. The index robot 220 and the guide rail 230 are disposed in the frame 210. The index robot 220 has a four-axis driven structure allowing a hand 221 directly handling the substrate 'W' to be movable and rotatable in the first direction 12, the second direction 14, and the third direction 16. The index robot 220 has the hand 221, an arm 222, a support 223, and a prop 224. The hand 221 is fixedly mounted in the arm 222. The arm 222 has an extensible and rotatable structure. The support 223 is provided such that the length of the support 223 extends in the third direction 16. The arm 222 is coupled to the support 223 to be movable along the support 223. The support 223 is fixedly coupled to the prop 224. The guide rail 230 is provided such that the length of the guide rail 230 extends in the second direction 14. The prop 224 is coupled to the guide rail 230 to be linearly movable along the guide rail 230. Although not illustrated, the frame 210 further includes a door opener that opens and closes a door of the cassette 20.

The first buffer module 300 has a frame 310, a first buffer 320, a second buffer 330, a cooling chamber 350, and a first buffer robot 360. The frame 310 has a rectangular parallelepiped shape having a hollowed structure, and is interposed between the index module 200 and the coating/developing module 400. The first buffer 320, the second buffer 330, the cooling chamber 350, and the first buffer robot 360 are positioned within the frame 310. The cooling chamber 350, the second buffer 330, and the first buffer 320 are arranged in the third direction 16 sequentially from the bottom. The first buffer 320 is positioned at a height corresponding to a coating module 401 of the coating/developing module 400, which will be described below, and the second buffer 330 and the cooling chamber 350 are positioned at a height corresponding to a developing module 402 of the coating/developing module 400, which will be described below The first buffer robot 360 is spaced apart from the second buffer 330, the cooling chamber 350, and the first buffer 320 by a specific distance in the second direction 14.

The first buffer 320 and the second buffer 330 temporarily store a plurality of substrates 'W'. The second buffer 330 has a housing 331 and a plurality of supports 332. The supports 332 are disposed inside the housing 331, and are spaced apart from each other along the third direction 16. One substrate 'W' is placed on each of the supports 332. The housing 331 has openings (not illustrated) in directions of providing the index robot 220, the first buffer robot 360, and a developing robot 482 of the developing module 402 to be described such that the index robot 220, the first buffer robot 360, and the developing robot 482 introduce or withdraw the substrate 'W' into or out of the support 332 provided inside the housing 331. The first buffer 320 has a structure substantially similar to that of the second buffer 330. Meanwhile, the housing 321 of the first buffer 320 has openings in directions of providing the first buffer robot 360 and a coating robot 432 positioned in the coating module 401 to be described. The number of supports 322 provided in the first buffer 320 may be equal to or different from the number of supports 332 provided in the second buffer 330. According to an embodiment, the number of the supports 332 provided in the second buffer 330 may be larger than the number of the supports 332 provided in the first buffer 320.

The first buffer robot 360 transfers the substrate 'W' between the first buffer 320 and the second buffer 330. The first buffer robot 360 has a hand 361, an arm 362, and a support 363. The hand 361 is fixedly installed in the arm 362. The arm 362 has an extensible structure such that the hand 361 is movable in the second direction 14. The arm 362 is coupled to the support 363 to be linearly movable along the support 363 in the third direction 16. The support 363 has a length extending from a location corresponding to the second buffer 330 to a location corresponding to the first buffer 320. The support 363 may be provided to extend longer upwards or downward. The first buffer robot 360 may be provided such that the hand 361 is simply two-axis driven along the second direction 14 and the third direction 16.

The cooling chamber 350 cools a substrate 'W'. The cooling chamber 350 has a housing 351 and a cooling plate 352. The cooling plate 352 has a top surface thereof on which a substrate 'W' is positioned and a cooling unit 353 that cools the substrate 'W'. Various types such as a cooling type using cooling water and a cooling type using a thermoelectric element may be used as the cooling unit 353. A lift pin assembly (not illustrated) may be provided in the cooling chamber 350 to position the substrate 'W' on the cooling plate 352. The housing 351 has openings (not illustrated) in directions of providing the index robot 220 and the developing robot 482 provided in the developing module 402 to be described such that the index robot 220 and the developing robot 482 introduce or withdraw the substrate 'W' into or out of the cooling plate 352. In addition, doors (not illustrated) that open and close the aforementioned openings may be provided in the cooling chamber 350.

The coating/developing module 400 performs a process of coating a photoresist on a substrate 'W' before an exposing process and a process of developing the substrate 'W' after the exposing process. The coating/developing module 400 has a substantially rectangular parallelepiped shape. The coating/developing module 400 has a coating module 401 and a developing module 402. The coating module 401 and the developing module 402 may be disposed to be partitioned from each other in different layers. According to an embodiment, the coating module 401 is positioned on the developing module 402.

The coating module 401 performs a process of coating a photosensitive liquid, such as a photoresist, on a substrate 'W' and a heat treatment process of, for example, heating and cooling the substrate 'W' before and after the resist coating process. The coating module 401 has a resist coating chamber 410, a bake unit 420, and a carrying chamber 430. The resist coating chamber 410, the bake unit 420, and the carrying chamber 430 are sequentially disposed in the second direction 14. Accordingly, the resist coating chamber 410 and the bake unit 420 are spaced apart from each other in the second direction 14 while the carrying chamber 430 is interposed therebetween. A plurality of resist coating chambers 410 may be provided in each of the first direction 12 and the third direction 16. In the drawings, six resist coating chambers 410 are illustrated by way of example. A plurality of bake units 420 may be provided in each of the first direction 12 and the third direction 16. In the drawings, six resist bake units 420 are illustrated by way of example. However, unlike this, a larger number of bake units 420 may be provided.

The carrying chamber 430 is positioned in parallel to the first buffer 320 of the first buffer module 300 in the first direction 12. A coating robot 432 and a guide rail 433 may be positioned in the carrying chamber 430. The carrying chamber 430 has a substantially rectangular shape. The coating robot 432 transfers a substrate 'W' between the bake units 420, the resist coating chambers 400, the first buffer 320 of the first buffer module 300, and the first cooling chamber 520 of the second buffer module 500 to be described below. The guide rail 433 is disposed such that the lengthwise direction thereof is parallel to the first direction 12. The guide rail 433 guides the coating robot 432 such that the coating robot 432 linearly moves in the first direction 12. The coating robot 432 has a hand 434, an arm 435, a support 436, and a prop 437. The hand 434 is fixedly mounted in the arm 435. The arm 435 has an extensible structure such that the hand 434 is movable horizontally. The support 436 is provided such that the length of the support 436 extends in the third direction 16. The arm 435 is coupled to the support 436 to be linearly movable along the support 436 in the third direction 16. The support 436 is fixedly coupled to the prop 437, and the prop 437 is coupled to the guide rail 433 to be movable along the guide rail 433.

The resist coating chambers 410 have the same structure. However, the resist coating chambers 410 may employ mutually different types of photoresists. For example, a chemical amplification resist may be used as the photoresist. The resist coating chamber 410 coats photoresist onto the substrate 'W'. The resist coating chamber 410 has a housing 411, a support plate 412, and a nozzle 413. The housing 411 has the shape of a cup having an open upper portion. The support plate 412 is positioned inside the housing 411 and supports the substrate W. The support plate 412 is rotatably provided. The nozzle 413 feeds photoresist onto the substrate 'W' placed on the support plate 412. The nozzle 413, which has a cylindrical tubular shape, supplies the photoresist to the center of the substrate 'W'. Alternatively, the nozzle 413 has a length corresponding to the diameter of the substrate 'W' and a discharge port of the nozzle 413 may be provided in the form of a slit. Additionally, the resist coating chamber 410 may further include a nozzle 414 supplying a cleaning liquid, such as deionized water, to clean the surface of the substrate 'W' coated with the photoresist.

The bake unit 420 is to perform heat treatment for the substrate 'W'. For example, the bake units 420 performs a prebake process of eliminating organic substances and moisture from the surface of the substrate 'W' by heating the substrate 'W' at a specified temperature before coating photoresist or a soft bake process, which is performed after coating photoresist to the substrate 'W', and performs a cooling process of cooling the substrate 'W' after the heating processes.

Figure 5:
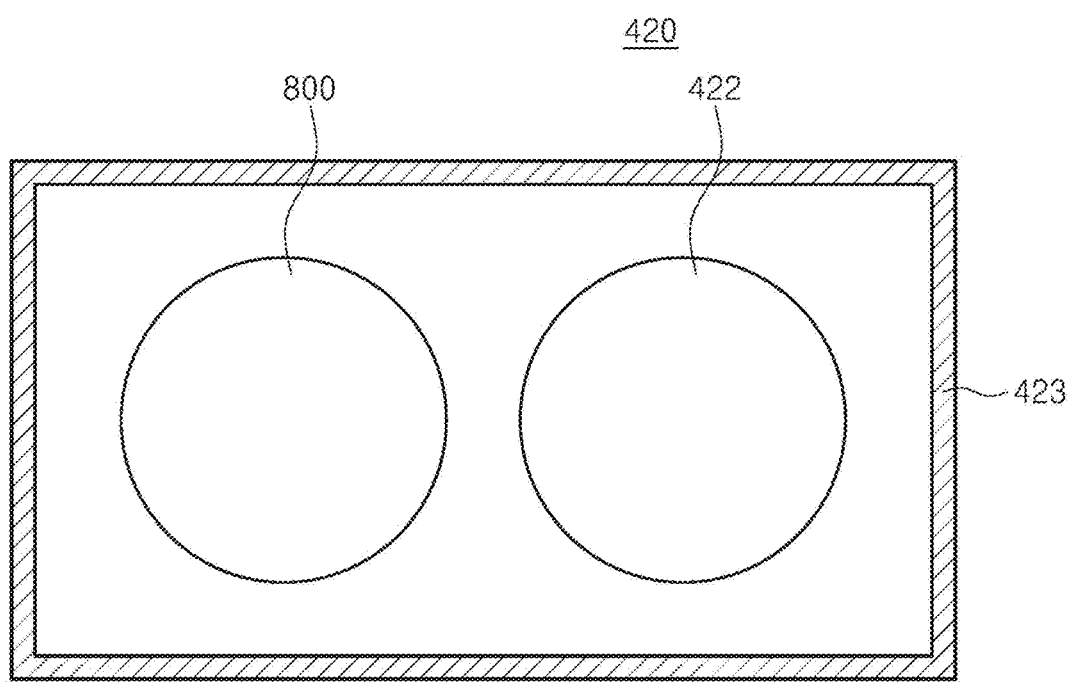
FIG. 5 is a plan view illustrating a bake unit according to an embodiment of the inventive concept.
Figure 6:
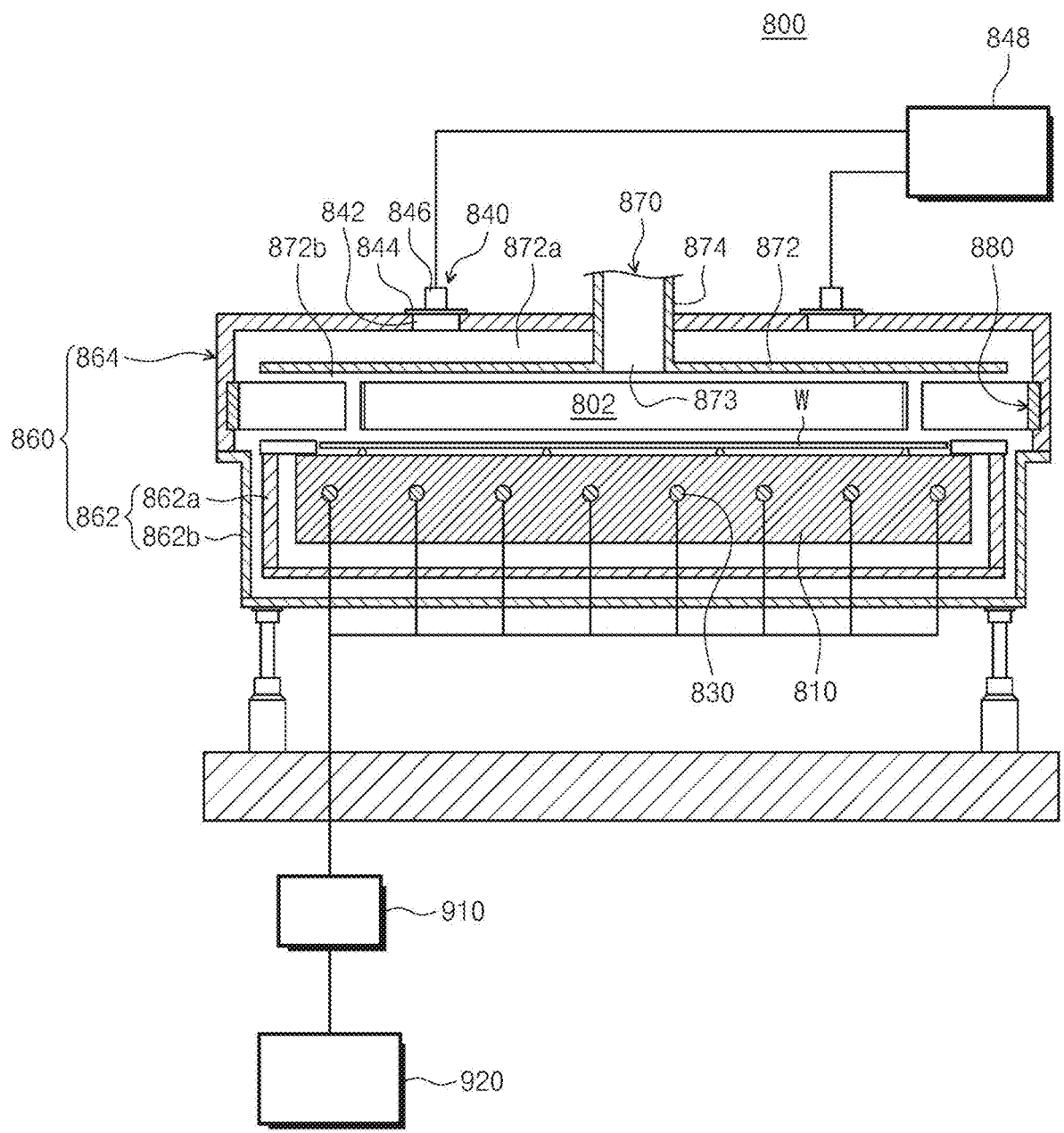
FIG. 6 is a sectional view illustrating a heat treatment unit to perform a heat treatment process, according to an embodiment of the inventive concept.

FIG. 5 is a plan view illustrating a bake unit according to an embodiment of the inventive concept, and FIG. 6 is a sectional view illustrating a heat treatment unit to perform a heat treatment process in the bake unit, according to an embodiment of the inventive concept.

Referring to FIGS. 5 and 6, the bake unit 420 may include a process chamber 423, a cooling plate 422, and an apparatus (substrate treating device) 800 for treating the substrate 'W'.

The process chamber 423 provides a heat treatment space 802 therein. The process chamber 423 may be provided in a rectangular parallelepiped shape. The cooling plate 422 may cool a substrate subject to heat treatment by the heat treatment unit 421. The cooling plate 422 may be positioned in the heat treatment space 802. The cooling plate 422 may be provided in a circular plate shape. The cooling plate 422 is provided therein with a cooling unit such as cooling water or a thermoelectric element. For example, the cooling plate 422 may cool the heated substrate to be at a room temperature.

The substrate treating device 800 performs heat treatment with respect to the substrate 'W'. The substrate treating device 800 may include a housing 860, a heating plate 810, a heating member 830, an external gas supply unit 840, an exhaust member 870, a temperature measuring member 910, and a control unit 920.

The housing 860 provides a treatment space 802 in which a heat treatment process for the substrate 'W' is performed. The housing 860 includes a lower body 862, an upper body 864, and a diver (not illustrated).

The lower body 862 may be provided in the shape of a tub having an open upper portion. The lower body 862 has a heating plate 810 and a heating member 830 which are positioned therein. The lower body 862 includes two-layer insulating covers 862a and 862b to prevent devices, which are positioned at a peripheral portion of the heating plate 810, from being thermally deformed. The two-layer insulating covers 862a and 862b minimize the exposure of the peripheral devices of the heating plate 810 to higher-temperature heat generated from the heating member 830. The two-layer insulating covers 862a and 862b includes a primary insulating cover 862a and a secondary insulating cover 862b, and the primary insulating cover 862a and the secondary insulating cover 862b are spaced apart from each other.

The upper body 864 may be provided in the shape of a tub having an open lower portion. As the upper body 864 is combined with the lower body 862, the treatment space 802 is formed between the upper body 864 and the lower body 862. The upper body 864 has a diameter greater than that of the lower body 862. The upper body 864 is positioned above the lower body 862. The upper body 864 is movable in a vertical direction by the driver. As the upper body 864 moves in the vertical direction, the upper body 864 is movable to a lifting position and a dropping position. In this case, the lifting position is a position in which the upper body 864 is spaced apart from the lower body 862, and the dropping position is a position in which the upper body 864 makes contact with the lower body 862. At the dropping position, the gap between the upper body 86 and the lower body 862 is blocked. Accordingly, when the upper body 864 is moved to the dropping position, the treatment space 802 is formed by the upper body 864, the lower body 862, and the heating plate 810.

Although not illustrated, the housing 860 may include a sealing member to prevent external air from being introduced into the treatment space. For example, the sealing member may seal the gap between the lower body 862 and the upper body 864.

The heating plate 810 is positioned in the heat treatment space 802. The heating plate 810 is positioned at one side of the cooling plate 422. The heating plate 810 is provided in the shape of a circular shape. A top surface of the heating plate 810 is performed as a support area in which the substrate 'W' is placed. A plurality of pin holes 812 are formed in the top surface of the heating plate 810. For example, three pin holes 812 may be provided. The pin holes 812 may be spaced apart from each other in a circumferential direction of the heating plate 810. The pin holes 812 may be spaced apart from each other at equal distances. A lift pin (not illustrated) is provided in each of the pin holes 812. The lift pin is movable in the vertical direction by a driving member (not illustrated).

The heating member 830 heats the substrate 'W' placed on the heating plate 810 to a preset temperature. A plurality of heating members 830 are provided in mutually different areas of the heating plate 810 to perform heat treatment with respect to each area of the substrate 'W'. The heating member 830 may include a plurality of heating zones 830a to 830g. The configuration of the heating member 830 will be described with reference to FIG. 7A below.

The temperature measuring member 910 may be connected with the heating member 830 to measure the temperatures in the plurality of heating zones 830a to 830g included in the heating member 830. The temperature measuring member 910 measures the temperature of the substrate 'W' making contact with the plurality of heating zones 830a to 830g and transmits the measured temperature information to the control unit 920. Although FIG. 6 illustrates that the temperature measuring member 910 is wiredly connected with the control unit 920, the temperature measuring member 910 may be wiredly or wirelessly connected with the control unit 920 to transmit/receive data.

The control unit 920 may control the heating member 830. The control unit 920 may independently control the temperature in each of the plurality of heating zones 830a to 830g included in the heating member 830. The control unit 920 may control the temperature only in some of the plurality of heating zones 830a to 830g included in the heating member 830. Hereinafter, a method of controlling the temperature of the heating member 830 by the control unit 920 will be described in detail.

Figure 7A:
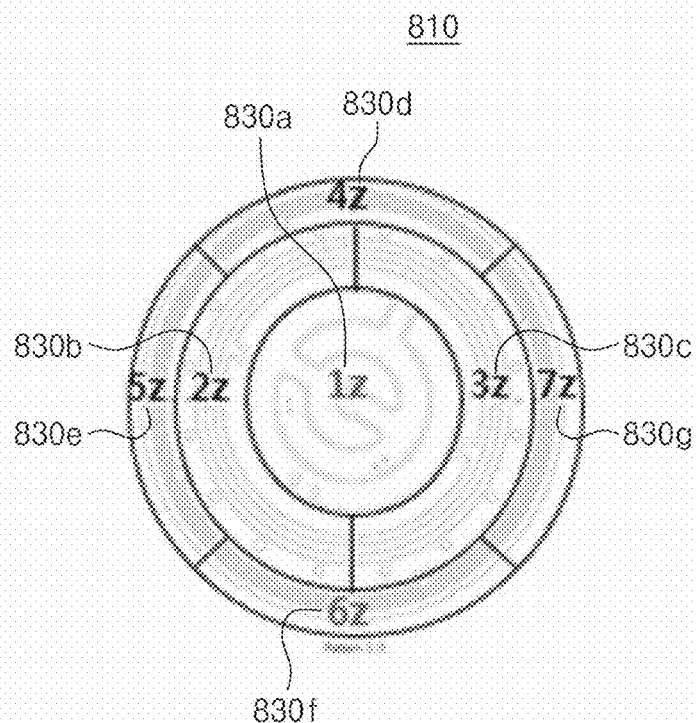
FIG. 7A is a view illustrating a heating plate and a heating member according to an embodiment of the inventive concept when viewed from above.
Figure 7B:
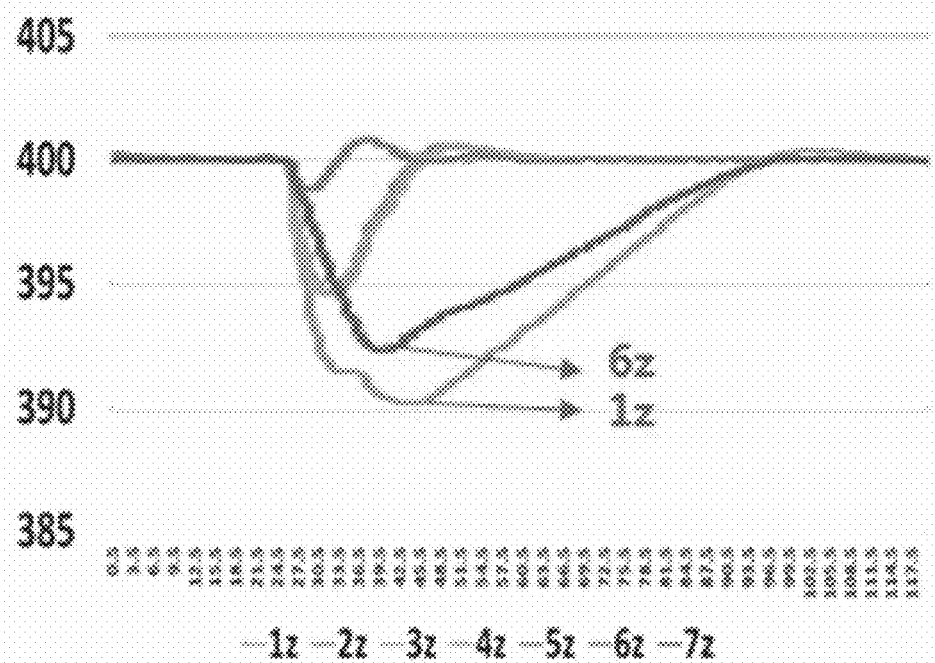
FIG. 7B is a graph illustrating a temperature change in each of a plurality of zones of the heating member.

FIG. 7A is a view illustrating the heating plate 810 and the heating member 830 according to an embodiment of the inventive concept when viewed from above, and FIG. 7B is a graph illustrating a temperature change in each of the plurality of zones 830a to 830g of the heating member 830.

FIG. 7A is a view illustrating the heating plate 810 and the heating member 830 according to an embodiment of the inventive concept when viewed from above. Referring to FIG. 7A, the heating plate 810 may include the heating member 830. The heating member 830 may be provided to include the plurality of heating zones 830a to 830g. Seven heating zones 830a to 830g may be provided. The number of a plurality of heating zones is not limited thereto, but may be distributedly formed in various areas on the plate in a range of two or more. The independent temperature control may be performed with respect to each of the plurality of heating zones 830a to 830g through the heating member 830 positioned in each heating zone.

FIG. 7B is a graph illustrating a temperature when the plurality of heating zones 830a to 830g are heated to the preset temperature illustrated in FIG. 7A. The temperature of the substrate 'W' is dropped for a specified time, increased through the bake process, and maintained to be in a specific range from a specific time point. In this case, a section, in which the temperature is dropped, may be defined as a temperature dropping section, a section in which the temperature is increased may be defined as a temperature increasing section, and a section in which the temperature is maintained to be in the specific range may be defined as an annealing section. In other words, a section until the temperature of the substrate 'W' reaches a normal temperature as the temperature of the substrate 'W' is dropped and then increased, may be defined as a dynamic state (dynamic section), and the following section may be defined as a static state (static section). Such a dynamic state may be a temperature section until the temperature of the heating plate reaches the normal temperature from when the substrate is placed on the heating plate which is heated to a specific temperature.

Referring to FIG. 7B, although the temperature applied to the plurality of heating zones is identically controlled to be a preset temperature, each of the plurality of heating zones may show a different temperature due to a disturbance or other causes as described above. Referring to FIG. 7B, the dynamic section of the first zone 830a and the sixth zone 830f of the plurality of heating zones 830a to 830g may represent temperature change greater than that of another heating zone. The inventive concept discloses a method for controlling a temperature using a temperature change graph in the dynamic section.

Figure 8:
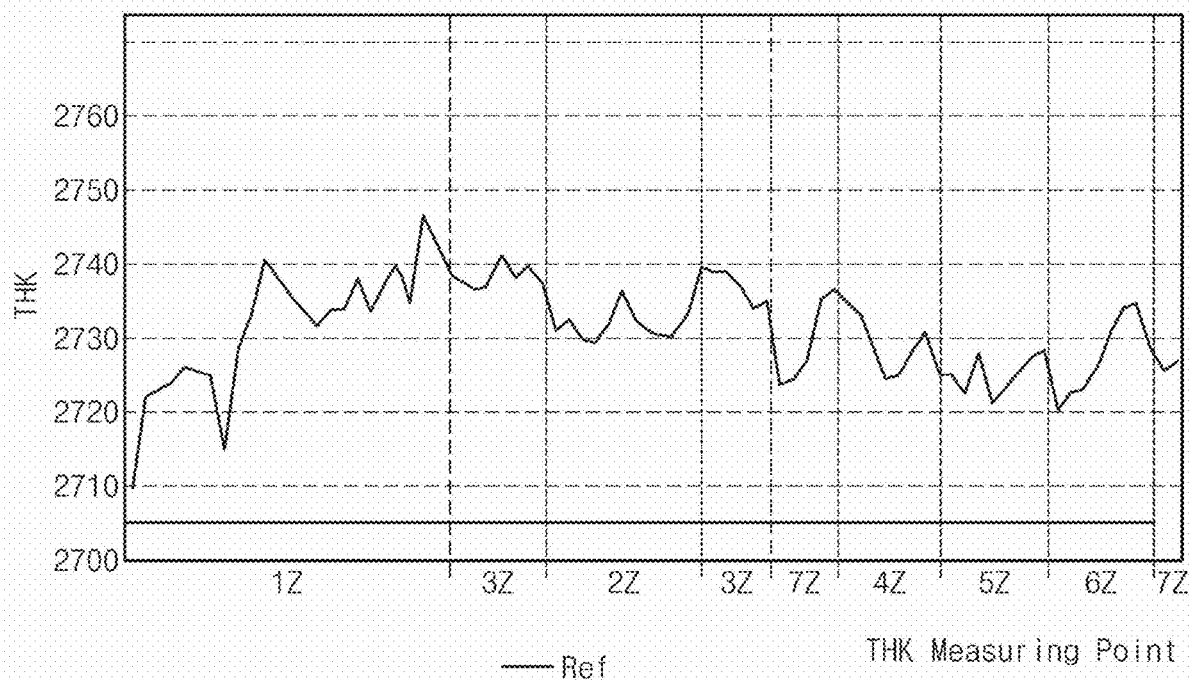
FIG. 8 is a graph illustrating the thickness of a thin film in each heating zone, when a plurality of heating zones are controlled at the same temperature.

FIG. 8 is a graph illustrating the thickness (thin film thickness) of a thin film in each heating zone, when a plurality of heating zones are controlled at the same temperature. In this case, the thin film thickness may be the thickness of a thin film formed on the substrate or the thickness of the photoresist. A horizontal axis in the graph of FIG. 8 refers to the plurality of heating zones in the heating member 830. A vertical axis in the graph of FIG. 8 refers to the thin film thickness of the substrate.

Theoretically, the thin film thickness of the substrate should be uniform in all of the plurality of heating zones. However, actually, the thin film thickness in the plurality of heating zones is varied due to the influence of disturbance. According to the inventive concept, temperature control is selectively performed by selecting a heating zone, which shows a specific value or more in error between thin film thickness values, which are obtained as results, of the plurality of heating zones 830a to 830g, and a target thin film thickness value.

According to a method for selecting a heating zone to be subject to the selective temperature control, the mean value of thin film thickness values is found in all heating zones based on the profile of a thin film thickness, and a heating zone, which shows a greater value in error between the mean value and the thin film thickness in each heating zones, may be selected.

Alternatively, according to a method for selecting a heating zone to be subject to the selective temperature control, the heating zone may be selected, in which the heating zone shows a greater value in error between a temperature in a normal state and a temperature in a dynamic sate, which results from the temperature control for the substrate, in the temperature change graph of the substrate for each of a plurality of heating zones.

According to an embodiment, according to the method for selecting the heating zone to be subject to the selective temperature control, the heating zone may be selected when the error is 5% or more based on the mean value or the temperature in the normal state.

However, this is provided only for the illustrative purpose, and the error ratio may be freely selected by a user. For example, the temperature control may be performed with respect to the plurality of heating zones. The following description will be made on the assumption that the first zone 830a and the sixth zone 830f are selected, as heating zones to be subject to the temperature control, from the plurality of heating zones.

After selecting the heating zones to be subject to the temperature control, a present thin film thickness and a target thin film thickness value are calculated with respect to each of selected heating zones. When present thin film thicknesses of the relevant zones are not uniform, the mean value of the present thin film thicknesses may be calculated as the present thin film thickness of the relevant zones.

The temperature control may be performed by using the dynamic section in the temperature change graph of a heating zone to be subject to the temperature control. The area of the dynamic section in the temperature change graph indicates the calorie (calorie loss) which is lost by the plate. According to the inventive concept, the calorie lost after the temperature change may be found by calculating the ratio between the calorie lost by the plate and the thin film thickness.

This may be expressed as in following equation.

$$THK_0 : \Delta THK = S : \Delta S \qquad \text{Equation}$$

$THK_0$ may denote a present thin film thickness, $\Delta THK$ may denote a desired change amount to a target thin film thickness, S may denote a lost calorie at a present temperature, and $\Delta T$ may denote the difference between a target calorie loss and a present calorie loss. The equation refers to that the ratio of the present thin film thickness to the target thin film thickness is equal to the ratio of the present calorie loss of the plate to a calorie loss after the temperature control.

The above description is expressed as in following equation. In the following equation, THK may denote a thin film thickness, S may denote the calorie loss of the plate, and $K_x$ may denote an influence coefficient of a zone adjacent to a specific zone when controlling the specific zone. $THK_T$ may denote a target thin film thickness, $S_0$ may denote a calorie loss before controlling the temperature of the plate, and $S_1$ may denote a calorie loss after the temperature control of the plate.

$$\Delta THK = (THK_T - THK_0)K_x = THK_0 \left(\frac{S_1}{S_0} - 1\right) K_x \quad \text{Equation}$$

The calorie loss after the temperature control to obtain the desired thin film thickness may be found using the above-described Equation. When the calorie loss of the plate after the temperature control is found, the temperature to be controlled may be set using following equation.

Figure 9:
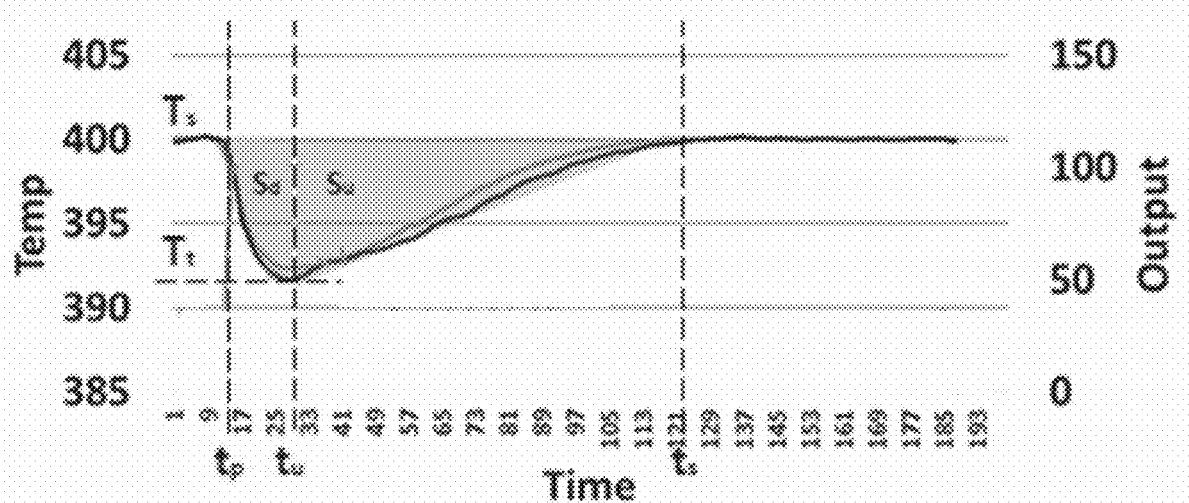
FIG. 9 is a view illustrating integration for temperature control in a temperature change graph according to the inventive concept.

This will be described by utilizing the graph of FIG. 9.

Figure 10:
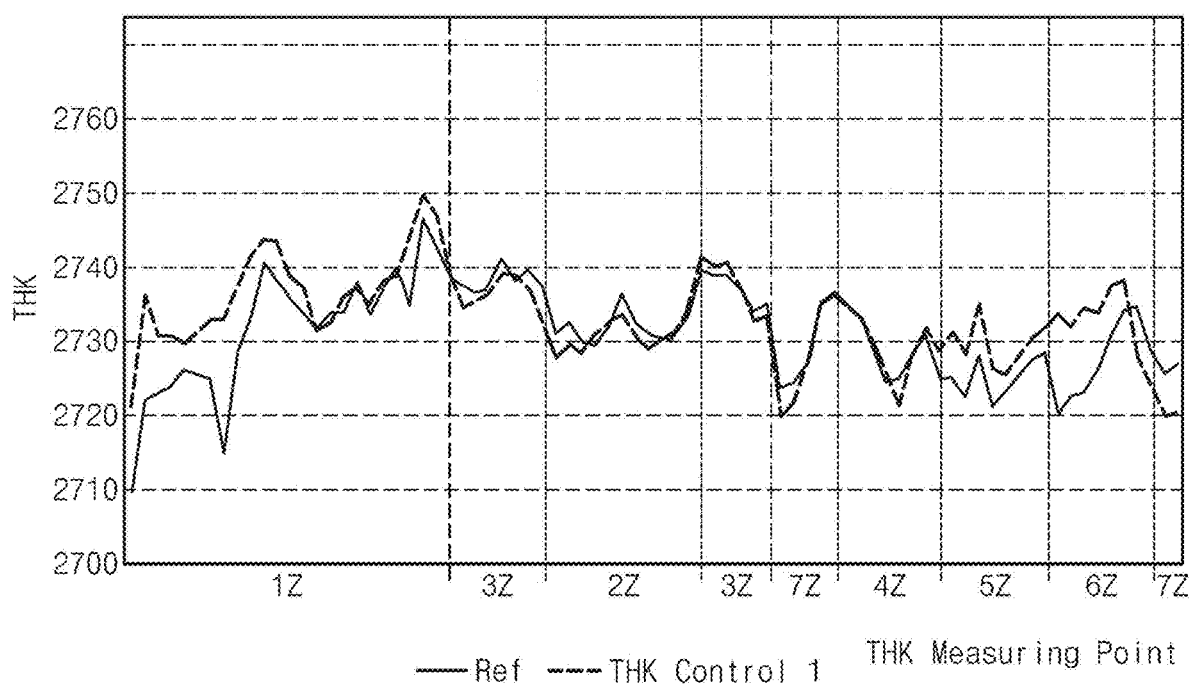
FIG. 10 illustrates a graph for a thickness of a thin film before temperature control and a graph for a thickness of a thin film after temperature control according to a plurality of heating zones.

According to the graph of FIG. 9, the calorie loss of the plate may be a value obtained by integrating a function of the dynamic section of the temperature change graph, which is expressed as in the following Equation.

$$S_n = S_{down} + S_{up} = \quad \text{Equation}$$
$$\int_{t_p}^{t_u} T_s - \left(\alpha e^{-\frac{t}{\beta(t_u - t)}} + \gamma\right) dt + \int_{t_u}^{t_s} T_s - \left\{\alpha\left(1 - e^{-\frac{t}{\beta(t_s - t)}}\right) + \gamma\right\} dt$$

Wherein $S_{down}$ may denote a calorie loss of the plate in the temperature dropping section of the dynamic section. $S_{down}$ may be a calorie loss occurring right after the pin is down and the substrate makes contact with the plate. $S_{up}$ denotes the calorie loss of the plate in the temperature increasing section of the dynamic section. $t_p$ may denote a starting time at which the pin is down. $t_u$ may denote a starting time at which the temperature of the dynamic section is increased. $t_s$ may denote a time to reach the temperature in the normal state, $T_s$ may denote a process temperature. Referring to FIG. 10, the process temperature may be set to 400°. α may be a value ($T_s - T_{target} = \Delta T$) obtained by subtracting a target temperature from the process temperature. $T_{target}$ may denote a target temperature to be dropped. β may be $$\delta \frac{\Delta T}{\Delta t} \cdot \delta$$

may denote an increasing coefficient or a dropping coefficient. γ may be $T_{target} (= T_t)$, that is may be the target temperature to be dropped.

The temperature to be controlled in a relevant heating zone may be calculated by using the above-described equation. However, the inventive concept is not limited thereto, but the temperature control may be performed with respect to each heating zone using various manners.

According to an embodiment, the control unit 920 may include a proportional-integral-derivative (PID) controller. The temperature control may be finely performed by using the PID controller included in the control unit 920, such that the temperature control is more exactly performed. The PID controller may determine the temperature dropping section, the temperature increasing section, and the annealing section using the gradient for the temperature change measured by the temperature measuring member 910.

When the gradient for the temperature change is less than a value in a preset range, a present section is determined as the temperature dropping section. When the gradient for the temperature change exceeds a preset range, the present section is determined as the temperature increasing section. When the gradient for the temperature change is within the preset range, the present section is determined as an annealing section. In the temperature dropping section, a PID controller, which shows a greater P gain value, of PID controllers may be connected to the heating member 830 to be controlled. In the temperature increasing section, the PID controller showing the greater P gain value may be connected to the heating member 830 to be controlled. In the annealing section, a PID controller, which shows a greater I gain value, of the PID controllers may be connected to the heating member 830 to be controlled. In the annealing section, a PID controller, which shows a greater D gain value, of the PID controllers may be connected to the heating member 830 to be controlled.

FIG. 10 illustrates a graph for a thickness of a thin film before temperature control and a graph for a thickness of a thin film after temperature control according to a plurality of heating zones. It may be recognized from FIG. 9 that the thin film thickness in the first zone and the sixth zone is changed to the mean value through the temperature control in the dynamic section. In addition, it may be recognized that the second zone to the fifth zone, and the seventh zone, which are remaining zones of a plurality of heating zones, are hardly changed. As described above, according to the method for controlling the temperature of the inventive concept, the thin film thickness of the substrate may be uniform.

Figure 11:
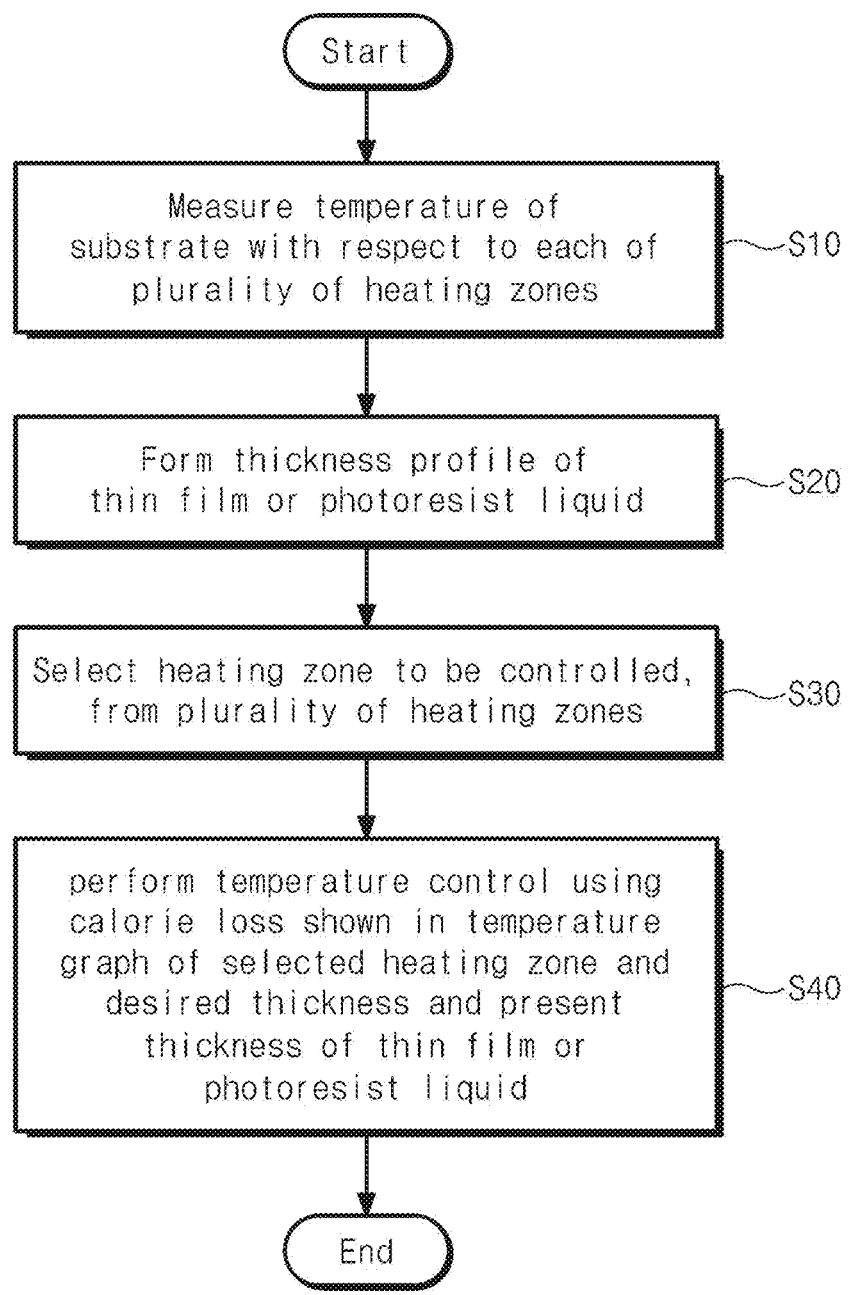
FIG. 11 is a flowchart illustrating a method for controlling a temperature, according to the inventive concept.

FIG. 11 is a flowchart illustrating a method for controlling a temperature, according to the inventive concept.

According to the method for controlling the temperature of the inventive concept, the temperature of the substrate is measured with respect to each of the plurality of heating zones (S10). The thickness profile of a thin film or a photoresist liquid corresponding to a measurement result for each of the plurality of heating zones is formed (S20). When the thickness profile is formed, the thickness profile is compared with a reference value to select a heating zone to be controlled (S30). The comparison may be performed based on the mean value of thin film thicknesses or photoresist liquid thicknesses or the reference value. When the heating zone to be controlled is selected, desired temperature control is possible through a calorie loss, a desired thickness of a thin film or a photoresist liquid, and a present thickness, which are shown in the temperature graph of the selected heating zone. The desired temperature control is possible through the control based on the PID controller.

According to the inventive concept, the uniformity of the thickness may be corrected by adjusting the calorie in the dynamic section of a carbon bonding structure affected by temperature in a bake process. The inventive concept may be utilized in the bake process having a target temperature. The inventive concept may be utilized in a technical field necessary for thickness adjustment.

According to embodiments of the inventive concept, the thickness of the thin film formed on the substrate may be uniformized by partially adjusting the temperature of the heating member.

According to embodiments of the inventive concept, the thickness of the thin film formed on the substrate may be uniformized by adjusting the thickness of the thin film corresponding to each of the plurality of heating zones of the heating member.

The effects of the inventive concept are not limited to the above effects. Any other effects not mentioned herein will be clearly understood from the following description by those skilled in the art to which the inventive concept pertains.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate by controlling a heating member provided at a lower portion of a plate supporting the substrate inside a housing and including a plurality of heating zones, the method comprising:
   measuring a temperature of the substrate with respect to each of the plurality of heating zones of the heating member;
   performing temperature control for a dynamic section of a temperature change graph shown as a result of the measurement;
   forming a profile of a thickness of a thin film on the substrate, which corresponds to the temperature measurement result for each of the plurality heating zones of the heating member; and
   controlling a temperature of a selected heating zone using a calorie loss of the plate, which is shown in the temperature graph of the selected heating zone, and a present thin film thickness and a desired thin film thickness of the selected heating zone.

2. The method of claim 1, further comprising:
   performing temperature control with respect to each of the plurality of heating zones of the heating member to uniformize the thickness of the thin film.

3. The method of claim 2, further comprising:
   selecting the heating zone showing a specific value or more in error with a reference value based on the profile of the thickness of the thin film on the substrate for the plurality heating zones; and
   performing temperature control for the selected heating zone by using a temperature graph in the selected heating zone and a thin film thickness value corresponding to a thickness value of a thin film corresponding to the selected heating zone.

4. The method of one of claim 1, further comprising:
   controlling the temperature of the heating member by adjusting a gain of a PID controller connected to the heating member.

5. A method for treating a substrate, the method comprising:
   forming a thin film of a photoresist liquid on the substrate by heating the substrate coated with the photoresist liquid to volatilize a solvent contained in the photoresist liquid; and
   uniformizing a thickness of a film of the photoresist liquid by partially controlling a temperature of a plate to heat the substrate;
   adjusting a temperature for a dynamic section of a temperature change graph of the substrate; forming a thickness profile of the thin film of the photoresist liquid based on a temperature change of the substrate; and controlling a temperature using a desired photoresist liquid thickness, a present photoresist liquid thickness, a present temperature of the substrate, and a calorie loss of the plate which is shown in the temperature graph of the substrate.

6. The method of one of claim 5, wherein the controlling of the temperature is performed by adjusting a gain of a PID controller.

* * * * *